(12) United States Patent
Dahan

(10) Patent No.: US 10,338,912 B2
(45) Date of Patent: Jul. 2, 2019

(54) UPDATING SOFTWARE BASED ON FUNCTION USAGE STATISTICS

(71) Applicant: Metrological Media Innovations B.V., Rotterdam (NL)

(72) Inventor: Albert Dahan, Rotterdam (NL)

(73) Assignee: Metrological Media Innovations B.V., Rotterdam (NL)

( * ) Notice: Subject to any disclaimer, the term of this patent is extended or adjusted under 35 U.S.C. 154(b) by 0 days.

(21) Appl. No.: 15/868,316

(22) Filed: Jan. 11, 2018

(65) Prior Publication Data

US 2018/0196662 A1 Jul. 12, 2018

Related U.S. Application Data

(60) Provisional application No. 62/445,590, filed on Jan. 12, 2017.

(51) Int. Cl.
G06F 9/44 (2018.01)
G06F 8/65 (2018.01)
G06F 11/30 (2006.01)
H03M 7/40 (2006.01)

(52) U.S. Cl.
CPC ............ *G06F 8/65* (2013.01); *G06F 11/3068* (2013.01); *G06F 2201/865* (2013.01); *H03M 7/40* (2013.01)

(58) Field of Classification Search
None
See application file for complete search history.

(56) References Cited

U.S. PATENT DOCUMENTS

2004/0255290 A1* 12/2004 Bates .................. G06F 8/65
717/174
2015/0363185 A1* 12/2015 Garratt ................ G06F 8/65
717/168

OTHER PUBLICATIONS

History of Lossless Data Compression Algorithms, XP055131838, Mar 24, 2014, p. 2, line 11-18; p. 6, line 16; p. 7, line 31, http://ieeeghn.org/wiki/index.php?title=History_of_Lossless_Data_Compression_Algorithms&oldid=96464&printable=yes&useskin+vector, Jul. 28, 2014.
Extended European Search Report issued in counterpart EP patent application No. 18151334.2., dated Jun. 19, 2018.

* cited by examiner

*Primary Examiner* — Qamrun Nahar
(74) *Attorney, Agent, or Firm* — Kaplan Breyer Schwarz, LLP

(57) ABSTRACT

A computer-implemented method of measuring and updating a software program in a client system, the software program comprising plural functions, the method comprising receiving statistics on the usage of certain functions in the software program in a predetermined time period and generating and issuing an update to the software based on the statistics, characterized by deriving a function mapping table mapping functions of the software program to abbreviations, said mapping being arranged in order of frequency of use of the functions as indicated in previously received statistics, and communicating said table to the client system, where said statistics received from the client system refer to the abbreviations instead of the functions.

11 Claims, 2 Drawing Sheets

UPDATING SOFTWARE BASED ON FUNCTION USAGE STATISTICS

FIELD OF THE INVENTION

The invention relates to a computer-implemented method of measuring and updating a software program in a client system, the software program comprising plural functions, the method comprising receiving statistics on the usage of certain functions in the software program in a predetermined time period and generating and issuing an update to the software based on the statistics.

BACKGROUND OF THE INVENTION

Almost every device today has embedded software inside. Such firmware provides almost all necessary functionality. Because firmware can be changed, bugs and limitations can be addressed and new features can be added without having to replace hardware. Firmware updates can be made in various ways, for example by having a user provide an update to the device by inserting a USB storage device. Updates can be provided in the form of a complete replacement firmware or in the form of limited changes to particular aspects of the firmware, for example replacing a single file or a certain number of bytes in the firmware.

In client-server configurations, such as television set-top boxes connected to a central server, firmware updates on the clients can be managed centrally. The server can transmit firmware updates to each client system, avoiding the user the hassle of having to do so manually. The server can keep track of which previous updates have been provided where, to ensure each client system receives the right new updates.

One important aspect of firmware is its performance. Firmware runs in a constrained environment; typically the hardware platform has limited memory, storage and/or processing capacity compared to general purpose computing platforms such as desktop computers or laptops. Thus, optimizing the firmware for the best performance in such a constrained environment is an important technical problem.

One known manner of addressing this problem is to employ statistics on the usage of certain software functions in the firmware in a predetermined time period. These statistics allow the identification of more and less relevant functions. For example, statistics can reveal that a particular function is used very frequently or that a particular function is often invoked together with another function.

These statistics may differ from user to user. For example, one user may often watch TV channels using the Electronic Program Guide (EPG) on the set-top box to select them, while another may prefer to use the box to play games or browse the Internet. These users would have very different function usage statistics. In addition, statistics may change from time to time, both in the short term and in the long term. In the short term, e.g. over a couple of days, usage may change e.g. from incidental watching of short programs during the work week to more intensive use in the weekend. In the long term, usage may change e.g. from passively watching children's shows to actively using games and interactive features.

Given these statistics it becomes possible to identify functions that are more relevant than others and to issue updates to the firmware addressing those functions to improve the functioning of the firmware. For example, a frequently-used function can be optimized to run faster, or provided with a pre-loading or caching feature. A function that is not used frequently anymore could have such features removed, or be moved to a separately-loadable module to make memory available for more frequently used functions. Two functions often used together could be integrated into a single module.

In some applications, it is desirable to issue very frequent updates, e.g. every few days, containing relatively small changes. This requires a constant delivery of function usage statistics. This could be a problem, as the return channel from client to server system is typically low-bandwidth. The statistics thus would not arrive in time, or only limited statistics could be provided. Therefore a technical problem is how to reduce the amount of data in the function usage statistics without loss of information.

SUMMARY OF THE INVENTION

The invention addresses the above problem by deriving a function mapping table mapping functions of the software program to abbreviations, said mapping being arranged in order of frequency of use of the functions as indicated in previously received statistics, and communicating said table to the client system, where said statistics received from the client system refer to the abbreviations instead of the functions. The use of abbreviations for function names in the function mapping table reduces the amount of data in the transmitted statistics. By deriving the abbreviations from frequency of use, e.g. using a run-length encoding algorithm, it is ensured that the most frequently used functions have the shortest abbreviations, thus reducing on average the amount of data the most. Abbreviations can be numeric or alphanumeric or other choice as desired.

The use of tables that change over time requires addressing table versions. This could be implemented e.g. by having the client report a version number included in the table available to it, and having the server include a new version number with each change to the table. Alternatively, this could be implemented by having the client confirm receipt of a new table. Other options are also available.

In an embodiment the method further comprises deriving a parameter mapping table mapping parameters of functions of the software program to abbreviations, said mapping being arranged in order of frequency of use of the parameters as indicated in previously received statistics, and communicating said table to the client system, where statistics received from the client system refer to the abbreviations instead of the parameters. In this embodiment the same inventive concept is employed on function parameters. Replacing parameter names or values with abbreviations further reduces the amount of data.

In a variation on this embodiment a number of most frequently used parameters are omitted from said table. Such most frequently used parameters can be stored separately on client and server, doing away with the need for including them in the table. This again further reduces the amount of data.

In a further embodiment the function and/or parameter statistics are received periodically, and said table is updated only after a predetermined number of periodic statistics. This reduces the number of tables sent in any given period of time.

In a yet further embodiment, instead of communicating the entire table each time, only changes to said table are communicated to the client system. This also reduces the number of table data sent in any given period of time.

The invention further provides for a server system configured to execute the method, a network comprising said server and plural clients, and to computer-readable storage medium comprising executable code for causing a computer to perform the method of the invention.

BRIEF DESCRIPTION OF THE FIGURES

The invention will now be explained in more detail with reference to the figures, in which.

In the figures, same reference numbers indicate same or similar features. In cases where plural identical features, objects or items are shown, reference numerals are provided only for a representative sample so as to not affect clarity of the figures.

DETAILED DESCRIPTION OF CERTAIN EMBODIMENTS

Figure 1:
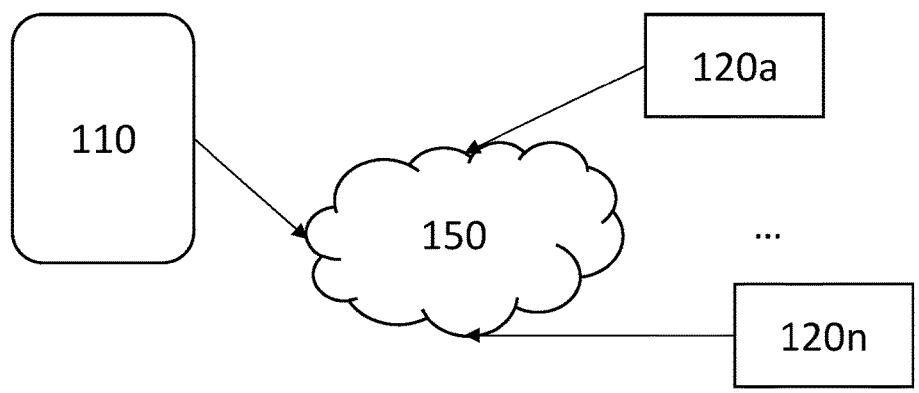
FIG. 1 schematically shows a network comprising a server system and plural client systems.

FIG. 1 schematically shows a network 150 comprising a server system 110 and plural client systems 120a, . . . , 120n connected to the server 110 through a network 150 such as the Internet. The client systems 120a, . . . , 120n are configured to communicate with the server 110 to receive data for processing and/or presentation, for example data representing audiovisual content such as movies or television programs may be received and rendered on a display screen and/or audio speakers (not shown). The client systems 120a, . . . , 120n are further configured to transmit data to the server 110, e.g. to request certain data or to provide feedback to a request by the server 110.

Figure 2:
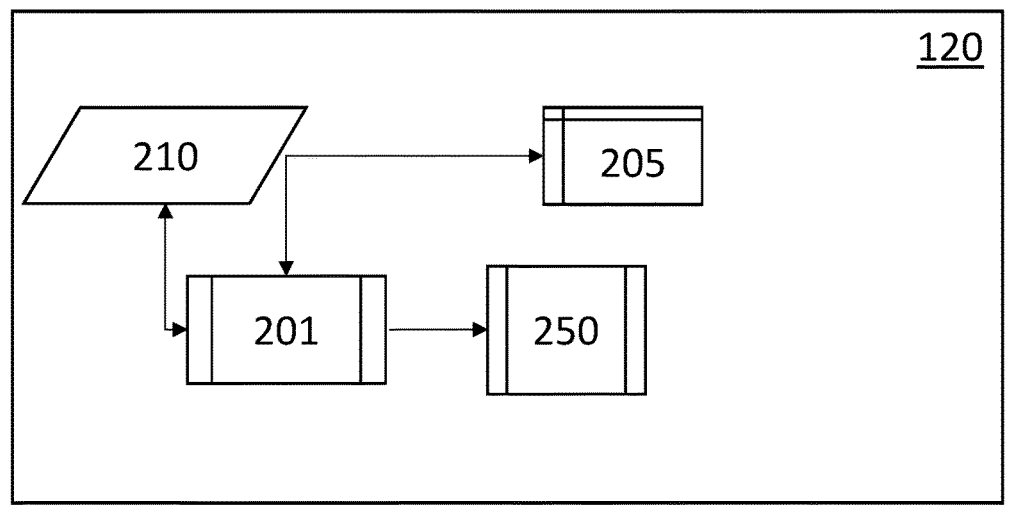
FIG. 2 schematically shows a client system in more detail.

FIG. 2 schematically shows a client system 120 in more detail. To deliver the functionality set out above, the client system 120 comprises one or more processing units 201 and storage 205, said storage comprising software for performing the mentioned actions as well as other functionality necessary in such client systems. Such client software comprises various functions, ranging from general functions such as rendering video to handling payment of pay-per-view services to specific functions such as decoding an MPEG data block or calculating a square root. It is worth noting that where this specification speaks of 'software', such software may be comprised of plural programs, libraries, modules or routines.

The client software can be updated in whole or in part from time to time to provide new functionality and/or to correct mistakes and/or to remove limitations. Client system 120 comprises an input/output module 210 to communicate with the server and to send and receive data. One such type of data comprises such updates. Updates can be provided as complete replacements of the client software, or as partial replacements.

The client system 120 comprises a module 250 for maintaining statistics on the usage of certain functions in the software program in a predetermined time period. The time period may vary over time, and/or can be changed as instructed by the server system 110. Function statistics may comprise how often the functions are called in the time period, which parameter values are often provided, which return values the functions provide and so on. As will be explained below, the statistics as reported refer to abbreviations instead of actual function names.

The statistics are reported to the server system 110. The statistics are reported periodically, preferably in near real-time, in which said table is updated only after a certain number of periodic statistics. This number may be predetermined or may change dynamically. In the interest of efficiency, it is preferred to report the statistics using UDP transmissions, although TCP transmissions (or indeed other transmission techniques) may also be used.

As will be discussed in more detail with reference to FIG. 3 below, the server system 110 generates and issues an update to the software based on these statistics, which the client system 120 subsequently adopts.

Figure 3:
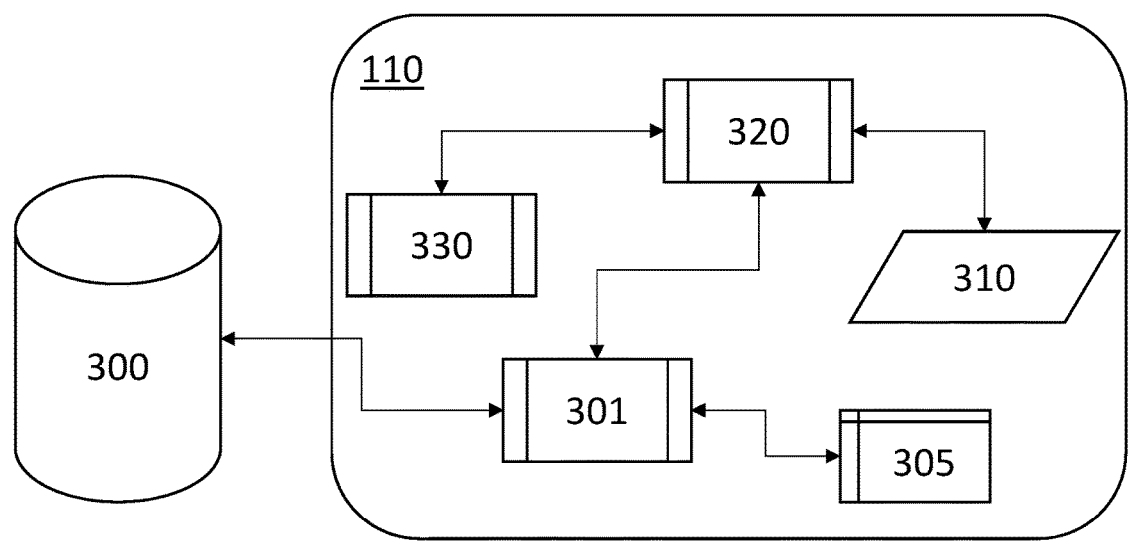
FIG. 3 schematically shows the server system in more detail.

FIG. 3 schematically shows the server system 110 in more detail. The server 110 is connected to storage 300 for storing data, e.g. client software in original and/or updated form, and/or updates to client software. Data to be processed by client systems 120a, . . . , 120n may also be stored in storage 300, alternatively in other storage (not shown) as is known in the art.

The server system 110 comprises one or more processing units 301 and storage 305, said storage comprising software for performing the mentioned actions as well as other functionality necessary in such server systems. The server system 110 further comprises module 310 that communicates with the module 210 of the client system 120 and to send and receive data. This module 310 receives the reported statistics as maintained by the module 250. The statistics are fed to an updating module 320 which generates an update based on the statistics, for example a more efficient routine for often-used functions or a more extensive implementation at the cost of other functions if so desired.

The module 320 employs a module 330 which derives a function mapping table. The mapping is arranged in order of frequency of use of the functions as indicated in the received statistics. Said table maps functions of the software program to abbreviations. Function names are typically relatively long names, e.g. as concatenation of English words indicating the function of the function such as startVideoPlayback( ). The mapping would provide shorter replacements for such names. Numbers provide a convenient choice to create the abbreviations. In one example the most frequently-used function is mapped to '1', the second most frequently-used function to '01', the third to '001', and so on. The mapping is reported to the client system 120, which subsequently refers to the abbreviations instead of the functions.

In a specific embodiment not only are functions mapped to abbreviations, but similarly parameters of such functions of the software program are mapped to abbreviations. As with the functions, said parameter mapping is then arranged in order of frequency of use of the parameters as indicated in previously received statistics, allowing client systems to refer to these parameter abbreviations. In one further embodiment, a number of most frequently used parameters are omitted from said table. This embodiment presupposes that these parameters were communicated previously, allowing their use based on these previous values.

Preferably instead of communicating the entire table each time, only changes to said table are communicated to the client system. This saves data when a low number of changes per update to the table are expected.

Note that in other embodiments than discussed here, the server system 110 may comprise plural physical devices. For example, multiple devices may be deployed to provide redundancy, or various functionalities mentioned above could be divided among different devices, e.g. one update server and one data delivery server. Further, note that each client 120*a*, . . . , 120*n* may comprise the same software but may also comprise different software, requiring different updates.

Figure 4:
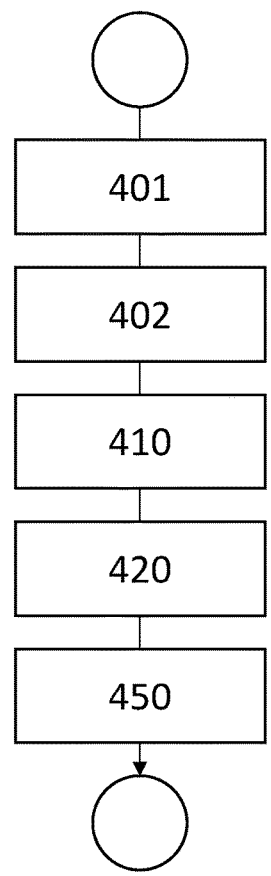
FIG. 4 provides a flowchart of steps performed by the server system in accordance with the invention.

FIG. 4 provides a flowchart of steps performed by the server system 110 in accordance with the invention. In step 401, the server 110 receives statistics on the usage of certain functions in the software program in a predetermined time period. Next, in step 402 the server 110 generates an update to the software based on the statistics. In step 410, the server 110 derives a function mapping table mapping functions of the software program to abbreviations, said mapping being arranged in order of frequency of use of the functions as indicated in previously received statistics. The mapping table is communicated to the client system 120 in step 420. In step 450 the server system 110 issues such update to the client system 120. Subsequent statistics received from the client system 120 refer to the abbreviations instead of the functions.

CLOSING NOTES

The above provides a description of several useful embodiments that serve to illustrate and describe the invention. The description is not intended to be an exhaustive description of all possible ways in which the invention can be implemented or used. The skilled person will be able to think of many modifications and variations that still rely on the essential features of the invention as presented in the claims. In addition, well-known methods, procedures, components, and circuits have not been described in detail.

Some or all aspects of the invention may be implemented in a computer program product, i.e. a collection of computer program instructions stored on a computer readable storage device for execution by a computer. The instructions of the present invention may be in any interpretable or executable code mechanism, including but not limited to scripts, interpretable programs, dynamic link libraries (DLLs), dynamically linked shared object libraries modules (.so files) or Java classes. The instructions can be provided as complete executable programs, as modifications to existing programs or extensions ("plugins") for existing programs. Moreover, parts of the processing of the present invention may be distributed over multiple computers or processors for better performance, reliability, and/or cost.

Storage devices suitable for storing computer program instructions include all forms of non-volatile memory, including by way of example semiconductor memory devices, such as EPROM, EEPROM, and flash memory devices, magnetic disks such as the internal and external hard disk drives and removable disks, magneto-optical disks and CD-ROM disks. The computer program product can be distributed on such a storage device, or may be offered for download through HTTP, FTP or similar mechanism using a server connected to a network such as the Internet. Transmission of the computer program product by e-mail is of course also possible. The computer program can be deployed on the internet as a service to be accessed through an Application Programming Interface and/or a web browser.

When constructing or interpreting the claims, any mention of reference signs shall not be regarded as a limitation of the claimed feature to the referenced feature or embodiment. The use of the word "comprising" in the claims does not exclude the presence of other features than claimed in a system, product or method implementing the invention. Any reference to a claim feature in the singular shall not exclude the presence of a plurality of this feature. The word "means" in a claim can refer to a single means or to plural means for providing the indicated function.

The invention claimed is:

1. A computer-implemented method of measuring and updating a software program in a client system, the software program comprising plural functions, the method comprising receiving in a server system, statistics on the usage of certain functions in the software program in a predetermined time period, generating and issuing an optimized update to the software to the client system based on the statistics, the optimized update subsequently adopted by the client system, deriving with the server system a function mapping table mapping functions of the software program to abbreviations, said mapping being arranged in order of frequency of use of the functions as indicated in previously received statistics, and communicating said table to the client system, where said statistics received from the client system refer to the abbreviations instead of the functions.

2. The method of claim 1, further comprising deriving a parameter mapping table mapping parameters of functions of the software program to abbreviations, said mapping being arranged in order of frequency of use of the parameters as indicated in previously received statistics, and communicating said table to the client system, where said statistics received from the client system refer to the abbreviations instead of the parameters.

3. The method of claim 2, in which a number of most frequently used parameters are omitted from said table.

4. The method of claim 1, in which said statistics are received periodically, and in which said table is updated only after a predetermined number of periodic statistics.

5. The method of claim 1, in which instead of communicating the entire table each time, only changes to said table are communicated to the client system.

6. A server system configured for updating a software program in a client system, the software program comprising plural functions, the server system comprising means for receiving statistics on the usage of certain functions in the software program in a predetermined time period, means for generating and issuing an optimized update to the software to the client system based on the statistics, the update subsequently adopted by the client system, means for deriving a function mapping table mapping functions of the software program to abbreviations, said mapping being arranged in order of frequency of use of the functions as indicated in previously received statistics, and means for communicating said table to the client system, where said statistics received from the client system refer to the abbreviations instead of the functions.

7. A network comprising the server system of claim 6 and plural client systems, said client systems being configured for receiving the update to the software and applying the update to the software program in the client systems.

8. The network of claim 7, in which the client systems are configured for providing statistics on the usage of certain functions in the software program in a predetermined time period to the server system.

9. A non-transitory computer-readable storage medium comprising executable code for causing a computer to perform the method of claim 1.

10. The method of claim 2, in which said statistics are received periodically, and in which said table is updated only after a predetermined number of periodic statistics.

11. The method of claim 2, in which instead of communicating the entire table each time, only changes to said table are communicated to the client system.

\* \* \* \* \*